US012376500B2

(12) United States Patent
Knapp et al.

(10) Patent No.: US 12,376,500 B2
(45) Date of Patent: Jul. 29, 2025

(54) QUANTUM DEVICES WITH TWO-SIDED OR SINGLE-SIDED DUAL-PURPOSE MAJORANA ZERO MODE JUNCTIONS

(71) Applicant: Microsoft Technology Licensing, LLC, Redmond, WA (US)

(72) Inventors: Christina Paulsen Knapp, Goleta, CA (US); Torsten Karzig, Redwood City, CA (US); Roman Bela Bauer, Santa Barbara, CA (US); Roman Mykolayovych Lutchyn, Santa Barbara, CA (US); Jonne Verneri Koski, The Hague (NL); Karl David Petersson, Copenhagen (DK)

(73) Assignee: Microsoft Technology Licensing, LLC, Redmond, WA (US)

( * ) Notice: Subject to any disclaimer, the term of this patent is extended or adjusted under 35 U.S.C. 154(b) by 451 days.

(21) Appl. No.: 17/870,969

(22) Filed: Jul. 22, 2022

(65) Prior Publication Data
US 2024/0032444 A1  Jan. 25, 2024

(51) Int. Cl.
 *G06N 10/20* (2022.01)
 *G06N 10/40* (2022.01)
 *H10N 60/10* (2023.01)
 *H10N 60/12* (2023.01)

(52) U.S. Cl.
CPC ............. *H10N 60/12* (2023.02); *G06N 10/20* (2022.01); *G06N 10/40* (2022.01); *H10N 60/128* (2023.02)

(58) Field of Classification Search
CPC ............................... G06N 10/20; G06N 10/40
See application file for complete search history.

(56) References Cited

U.S. PATENT DOCUMENTS

| 2018/0053113 A1 | 2/2018 | Lutchyn et al. |
| 2019/0013457 A1 | 1/2019 | Lutchyn et al. |
| 2021/0005661 A1 | 1/2021 | Freedman et al. |

(Continued)

FOREIGN PATENT DOCUMENTS

WO      2023284936 A1      1/2023

OTHER PUBLICATIONS

Zhang, H., Liu, CX., Gazibegovic, S. et al. Retracted Article: Quantized Majorana conductance. Nature 556, 74-79 (2018). https://doi.org/10.1038/nature26142 (Year: 2018).*

(Continued)

*Primary Examiner* — Matthew L Reames
(74) *Attorney, Agent, or Firm* — Ranjeev Singh; Singh Law, PLLC

(57) ABSTRACT

Quantum devices with two-sided or single-sided dual-purpose Majorana zero mode (MZM) junctions are described. An example quantum device comprises at least one superconducting island configurable to support at least one pair of Majorana zero modes (MZMs). The quantum device further includes a first conductor configurable to be coupled with at least one MZM of the at least one pair of MZMs, where the first conductor is configurable to be in at least one of a grounded state or a Coulomb blockade state. The quantum device further includes a second conductor configurable to be coupled with the at least one MZM of the at least one pair of MZMs, where the second conductor is configurable to be in at least one of a grounded state or a Coulomb blockade state.

20 Claims, 13 Drawing Sheets

(56) References Cited

U.S. PATENT DOCUMENTS

| | | | |
|---|---|---|---|
| 2021/0011771 A1 | 1/2021 | Bonderson et al. | |
| 2021/0336119 A1 | 10/2021 | Utchyn et al. | |
| 2022/0036227 A1 | 2/2022 | Karzig et al. | |

OTHER PUBLICATIONS

Qing Lin He et al. , Retracted: Chiral Majorana fermion modes in a quantum anomalous Hall insulator-superconductor structure. Science357,294-299(2017).DOI:10.1126/science.aag2792 (Year: 2017).*

Frolov, Sergey "Quantum computing's reproducibility crisis: Majorana fermions," Comment Nature Apr. 2021 https://www.nature.com/articles/d41586-021-00954-8 (Year: 2021).*

Frolov, Sergey "The Fallen Angel Particle," https://espressospin.org/2022/11/17/the-fallen-angel-particle/ 2022 (Year: 2022).*

Hess et al. Hes et al Reply Physical Review Letters 132, 099602 (2024) https://journals.aps.org/prl/abstract/10.1103/ PhysRevLett. 132.099602 (Year: 2024).*

Morteza Aghaee et al.* "InAs—Al hybrid devices passing the topological gap protocol," Physical Review B 107, 245423 (2023) https://journals.aps.org/prb/abstract/10.1103/PhysRevB.107.245423 (Year: 2023).*

Kamien et al "Editorial: Transparency in Physical Review Articles" Physical Review B 107, 230001 (2023) https://journals.aps.org/prb/abstract/10.1103/PhysRevB.107.230001 (Year: 2023).*

Savitsky, Zack "The Quantum Phantom," Science Dec. 2023 https://www.science.org/content/article/ghostly-quasiparticle-rooted-century-old-mystery-unlock-quantum-computings-potential# (Year: 2023).*

Aghaee, et al., "InAs—Al Hybrid Devices Passing the Topological Gap Protocol", In Repository of arXiv:2207.02472v1, Jul. 6, 2022, pp. 1-34.

Deng, et al., "Nonlocality of Majorana Modes in Hybrid Nanowires", In Journal of Physics Review B, vol. 98, Issue 8, Aug. 13, 2018, pp. 1-10.

Zhou, et al., "Fusion of Majorana bound states with mini-gate control in two-dimensional systems", In Journal Nature Communications, vol. 13, Issue 1, Apr. 1, 2022, pp. 1-10.

"International Search Report and Written Opinion Issued in PCT Application No. PCT/US2023/022010", Mailed Date: Aug. 31, 2023, 17 Pages.

"International Search Report and Written Opinion issued in PCT Application No. PCT/US2023/022016", Mailed Date: Sep. 20, 2023, 19 Pages.

Prada, et al., "Measuring Majorana Nonlocality and Spin Structure with a Quantum Dot", In Journal of Physical Review B, vol. 96, Issue 8, Aug. 11, 2017, pp. 1-10.

Sherman, et al., "Normal, Superconducting and Topological Regimes of Hybrid Double Quantum Dots", In Journal of Nature Nanotechnology, Nov. 14, 2016, pp. 212-217.

Fidkowski, et al., "Majorana Zero Modes in 1D Quantum Wires Without Long-Ranged Superconducting Order", In Repository of arXiv:1106.2598v3, Jul. 6, 2011, 14 Pages.

Haim, et al., "Signatures of Majorana Zero Modes in Spin-Resolved Current Correlations", In Repository of arXiv:1411.0673v2, Apr. 28, 2015, 8 Pages.

Karzig, et al., "Scalable Designs for Quasiparticle-Poisoning-Protected Topological Quantum Computation with Majorana Zero Modes", In Repository of arXiv:1610.05289v4, Jun. 21, 2017, 34 Pages.

Knapp, et al., "Dephasing of Majorana-based Qubits", In Repository of arXiv:1711.03968v3, May 22, 2018, 15 Pages.

Petersson, et al., "Charge and Spin State Readout of a Double Quantum Dot Coupled to a Resonator", In Repository of arXiv:1004.4047v1, Apr. 23, 2010, 5 Pages.

Pikulin, et al., "Protocol To Identify A Topological Superconducting Phase In A Three-Terminal Device", In Repository of arXiv:2103.12217v1, Mar. 22, 2021, 28 Pages.

Plugge, et al., "Majorana Box Qubits", In Repository of arXiv:1609.01697v2, Dec. 21, 2016, 11 Pages.

Thakurathi, et al., "Transport Signatures of Topological Phases in Double Nanowires Probed by Spin-Polarized STM", In Repository of arXiv:2001.05470v1, Jan. 15, 2020, 12 Pages.

Tran, et al., "Optimizing Clifford Gate Generation for Measurement-Only Topological Quantum Computation with Majorana Zero Modes", In Repository of arXiv:1909.03002v4, Mar. 27, 2020, 72 Pages.

Zhang, et al., "Next Steps of Quantum Transport in Majorana Nanowire Devices", In Journal of Nature Communications, vol. 10, Article No. 5128, Nov. 12, 2019, 7 Pages.

Cao, et al., "Recent Progress on Majorana in Semiconductor-Superconductor Heterostructures-Engineering and Detection", In Repository of arXiv:2206.06916v1, Jun. 14, 2022, 19 Pages.

"International Search Report and Written Opinion Issued in PCT Application No. PCT/US2023/022011", Mailed Date: Jul. 27, 2023, 12 Pages.

\* cited by examiner

QUANTUM DEVICES WITH TWO-SIDED OR SINGLE-SIDED DUAL-PURPOSE MAJORANA ZERO MODE JUNCTIONS

BACKGROUND

Measurement-based Majorana zero mode (MZM) qubits require tuning into the topological phase and qubit measurements. Traditional junctions used with MZM qubits are configured and operated to provide only one of these functions. Accordingly, there is a need for improvements to Majorana zero mode (MZM) junctions.

SUMMARY

In one example, the present disclosure relates to a quantum device comprising at least one superconducting island configurable to support at least one pair of Majorana zero modes (MZMs). The quantum device may further include a first conductor configurable to be coupled with at least one MZM of the at least one pair of MZMs, where the first conductor is configurable to be in at least one of a grounded state or a Coulomb blockade state. The quantum device may further include a second conductor configurable to be coupled with the at least one MZM of the at least one pair of MZMs, where the second conductor is configurable to be in at least one of a grounded state or a Coulomb blockade state.

In another example, the present disclosure relates to a quantum device comprising at least one superconducting island configurable to support at least one pair of Majorana zero modes (MZMs). The quantum device may further include a conductor configurable to be coupled with at least one MZM of the at least one pair of MZMs, where the conductor is configurable to be in at least one of a grounded state or a Coulomb blockade state.

In yet another example, the present disclosure relates to a quantum device comprising at least one superconducting island configurable to support at least one pair of Majorana zero modes (MZMs). The quantum device may further include a first conductor configurable to be coupled with at least one MZM of the at least one pair of MZMs via a first tunable coupling, where the first conductor is configurable to be in at least one of a grounded state or a Coulomb blockade state. The quantum device may further include a first cutter gate for tuning the first tunable coupling. The quantum device may further include a second conductor configurable to be coupled with the at least one MZM of the at least one pair of MZMs via a second tunable coupling, where the second conductor is configurable to be in at least one of a grounded state or a Coulomb blockade state. The quantum device may further include a second cutter gate for tuning the second tunable coupling independent of the first tunable coupling.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The present disclosure is illustrated by way of example and not limited by the accompanying figures, in which like references indicate similar elements. Elements in the figures are illustrated for simplicity and clarity and have not necessarily been drawn to scale.

DETAILED DESCRIPTION

Figure 1:
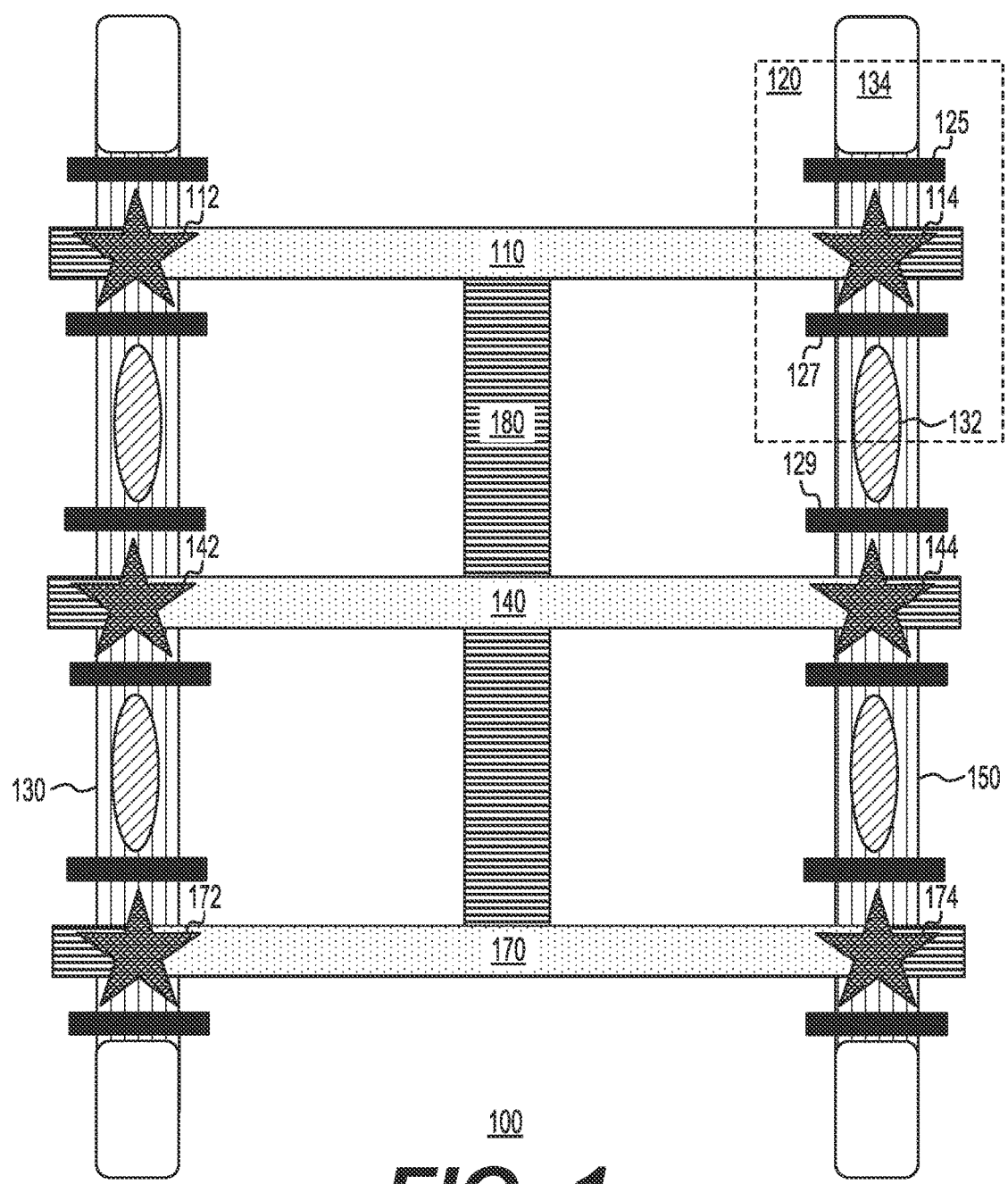
FIG. 1 is a block diagram of a quantum device with two-sided dual-purpose Majorana zero mode (MZM) junctions in accordance with one example.

Examples described in this disclosure relate to quantum devices with two-sided or single-sided dual-purpose Majorana zero mode (MZM) junctions. Quantum devices with MZM qubits require rapidly configuring couplings between different pairs of MZMs for qubit operations and measurement. As used herein, the term qubit refers to any quantum system that can be in a superposition of two quantum states, 0 and 1. Consistent with the present disclosure several examples of quantum devices with two-sided or single-sided MZM dual-purpose junctions that allow MZMs to couple to transport leads or quantum dots in Coulomb blockade are described. These junctions are useful in Majorana-based qubits. When configured for transport measurements, the junctions can be used to tune the qubit using transport signatures of the topological phase. When configured to couple MZMs and quantum dots, the junctions support operation of the measurement-based MZM qubits. Two example families of these junctions include: (1) two-sided junctions that allow an MZM to independently couple to two separate conductors, either of which can be configured to be a transport lead or a quantum dot in Coulomb blockade and (2) single-sided junctions that allow an MZM to couple to just one conductor that can configured to either be a transport lead or a quantum dot in Coulomb blockade. Both junction types are useful for different qubit layouts.

MZM qubits may be built from topological superconducting wires. Example implementations of such qubits includes semiconductor-superconductor heterostructures that are obtained, for instance, by depositing superconductor on a semiconductor two dimensional gas (2DEG) and using gates to define the different regions of the qubits (e.g., topological wires, trivial wires, junctions, and quantum dots). In this scheme, the topological phase supporting MZMs needs to be tuned by appropriately configuring these gates and by applying an external magnetic field. One of the ways to tune such a quantum system into a topological phase is to use transport characteristics of the topological phase to identify the favorable parameter space. Thus, even though transport is not needed for operation of these measurement-based MZM qubits, tunable connections to transport leads are helpful in that they allow one to bring-up the qubit, and subsequently they can be disconnected to allow the qubit to be operated.

The present disclosure describes dual-purpose MZM junctions that allow an MZM to be coupled to either a transport lead or to a quantum dot in Coulomb blockade. Certain measurement-based MZM qubits require tunable MZM junctions. In the idle configuration of the qubit, all junctions are closed and MZMs can only hybridize through the superconductor wire separating them; this leads to exponentially small degeneracy splittings, which is the root of topological protection of these qubits. The operations are performed in a measurement-only scheme by coupling pairs of MZMs through adjacent quantum dots (QDs) and performing measurements on these QDs to read out the qubit state. The qubit thus requires tunable junctions between the MZMs and the quantum dots to support different qubit configurations.

The best configuration of such a dual-purpose MZM junction may depend upon the type of qubit design under consideration. A two-sided dual-purpose junction (e.g., two-sided dual-purpose junctions described with respect to FIGS. 1-8) contacts the MZM on both sides of the superconducting wire. As such, a two-sided dual-purpose MZM junction connects the MZM to two conductors, each of which can either be configured to be a transport lead or a quantum dot in Coulomb blockade. Either side of the junction is independently tunable, which can be achieved through designated cutter gates. The junction can be tuned so that both sides of the junction are completely pinched off, for instance in the qubit configuration when that MZM is not being measured. The two-sided dual-purpose MZM junctions can have a single layer gate configuration, a dual layer gate configuration, or a combination of these two configurations. Moreover, the gates corresponding to the MZM junctions may also be formed in more than two layers.

A single-sided dual-purpose junction (e.g., single-sided dual-purpose junctions described with respect to FIGS. 9-13) contacts the MZM on just one side of the wire; it thus couples the MZM to a single conductor, which can be configured to function either as a transport lead or as a quantum dot in the Coulomb blockade regime. The coupling to the conductor is controlled through a designated cutter gate, which can be fully pinched off when that MZM is not being measured. One benefit of a single-sided dual-purpose junction is that there is a single-type of MZM junction that needs to be optimized for the qubit. Having one such type of junction can simplify experiments. Another benefit is that when the conductor is in Coulomb blockade but the cutter gate to the transport lead is in the tunneling regime, the electron-electron interactions in the conductor can remove unwanted bound states in the junction through level repulsion, resulting in better controllability. Just as not all designs can support two-sided dual-purpose MZM junctions, not all designs can support single-sided dual-purpose MZM junctions. As with the two-sided dual-purpose MZM junctions, a single-sided dual-purpose MZM junction can have a single layer gate configuration, a dual layer gate configuration, or a combination of these two configurations. Moreover, the gates corresponding to the MZM junctions may also be formed in more than two layers.

FIG. 1 is a block diagram of a quantum device 100 with two-sided dual-purpose Majorana zero mode (MZM) junctions in accordance with one example. Quantum device 100 may include topological superconductors (e.g., 110, 140, and 170) that are coupled via a trivial superconductor 180 (e.g., a qubit backbone). The combination of the topological superconductors and the backbone may be referred to as a superconducting island. Each of superconductors 110, 140, 170, 180 may be formed as nanowires. As an example, superconductors 110, 140, 170, and 180 may be formed as superconductor wires (e.g., indium arsenide (InAs) wires) coated by a superconductor (e.g., aluminum (Al)). Ends of topological superconductors 110, 140, and 170 may further be coupled via semiconducting regions 130 and 150. In one example, the terms topological and trivial refer to the phase of the superconductor and even a single superconducting nanowire can have sections that are tuned using electrostatic gates to form topological or trivial superconducting sections.

Figure 2:
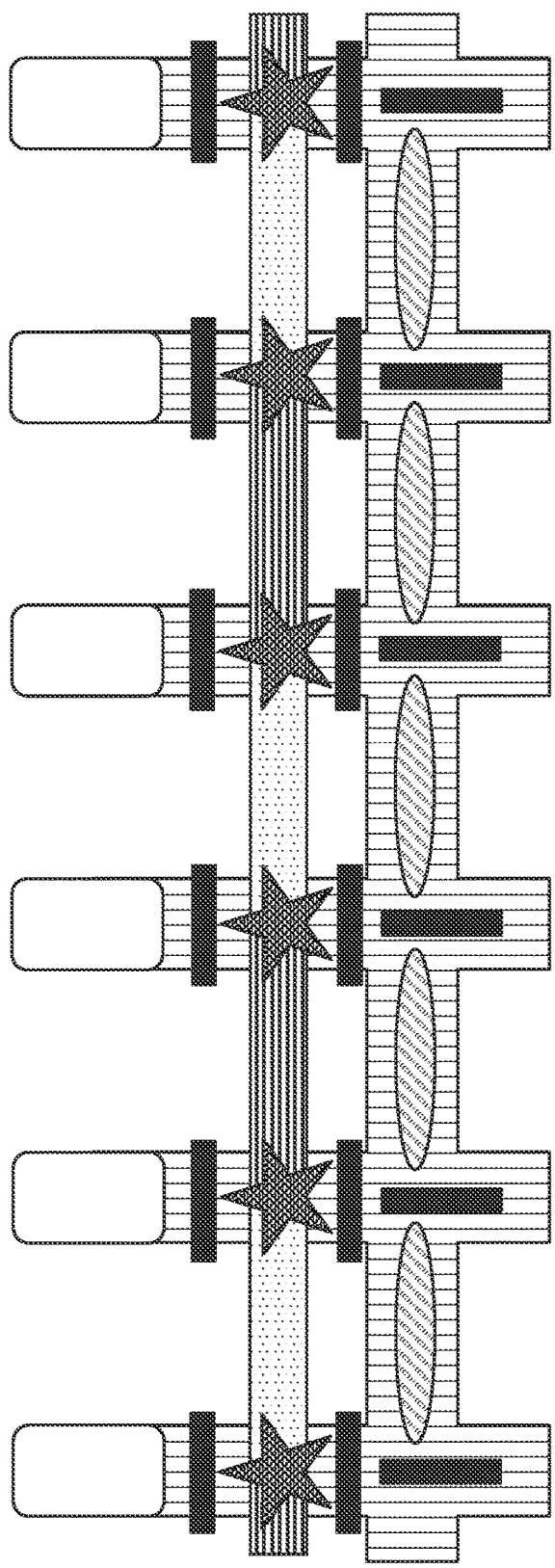
FIGS. 2 and 3 show additional block diagrams of example quantum devices with two-sided dual-purpose MZM junctions.
Figure 3:
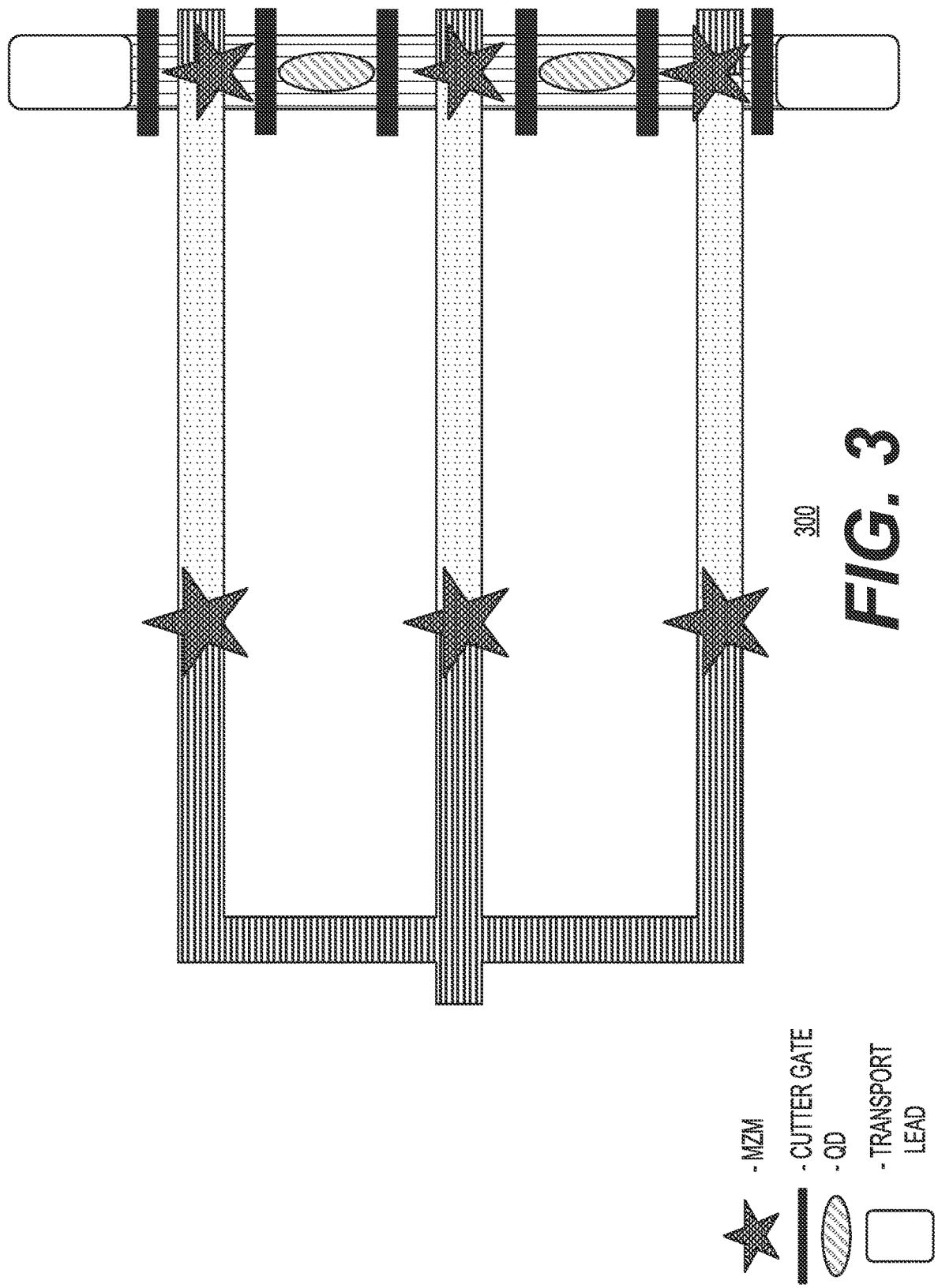

With continued reference to FIG. 1, quantum device 100 is operated such that Majorana zero modes (MZMs) 112 and 114 are formed at the ends of topological superconductor 110, MZMs 142 and 144 are formed at the ends of topological superconductor 140, and MZMs 172 and 174 are formed at the ends of topological superconductor 170. MZM junctions corresponding to the MZMs may allow for the tunable coupling of MZMs to each other or to transport leads. As an example, quantum device 100 is shown as having a two-sided dual-purpose MZM junction 120, which connects the MZM (e.g., MZM 114) to two conductors, either of which can be configured to be in a grounded state or in a Coulomb blockade state. Either side of the junction is independently tunable, which can be achieved through designated cutter gates. The junction can be tuned so that both sides of the junction are completely pinched off, for instance in the qubit configuration when that MZM is not being measured. MZM junction 120 includes cutter gates 125 and 127, a region adjacent quantum dot 132, and a region adjacent transport lead 134. Depending on the voltages applied to cutter gates 125 and 127, respectively, the region adjacent to quantum dot 132 and the region adjacent to transport lead 134 may be tuned. Advantageously, having two-sided dual-purpose MZM junctions (e.g., MZM junction 120) that can couple MZMs to transport leads facilitates the tuning of superconductors 110, 140, and 170 of quantum device 100 into topological phase. Moreover, the same two-sided dual-purpose MZM junctions also allow MZMs to be disconnected from transport leads (e.g., transport lead 134 acting as one conductor) and be connected to quantum dots (e.g., quantum dot 132 acting as the other conductor) in Coulomb blockade, which is needed for qubit measurement. Although FIG. 1 shows quantum device 100 as including a certain number of components arranged and coupled in a certain way, quantum device 100 may include fewer or additional components arranged and coupled differently. As an example, FIGS. 2 and 3 show additional block diagrams of quantum device 200 and another quantum device 300 with two-sided dual-purpose MZM junctions.

Figure 4:
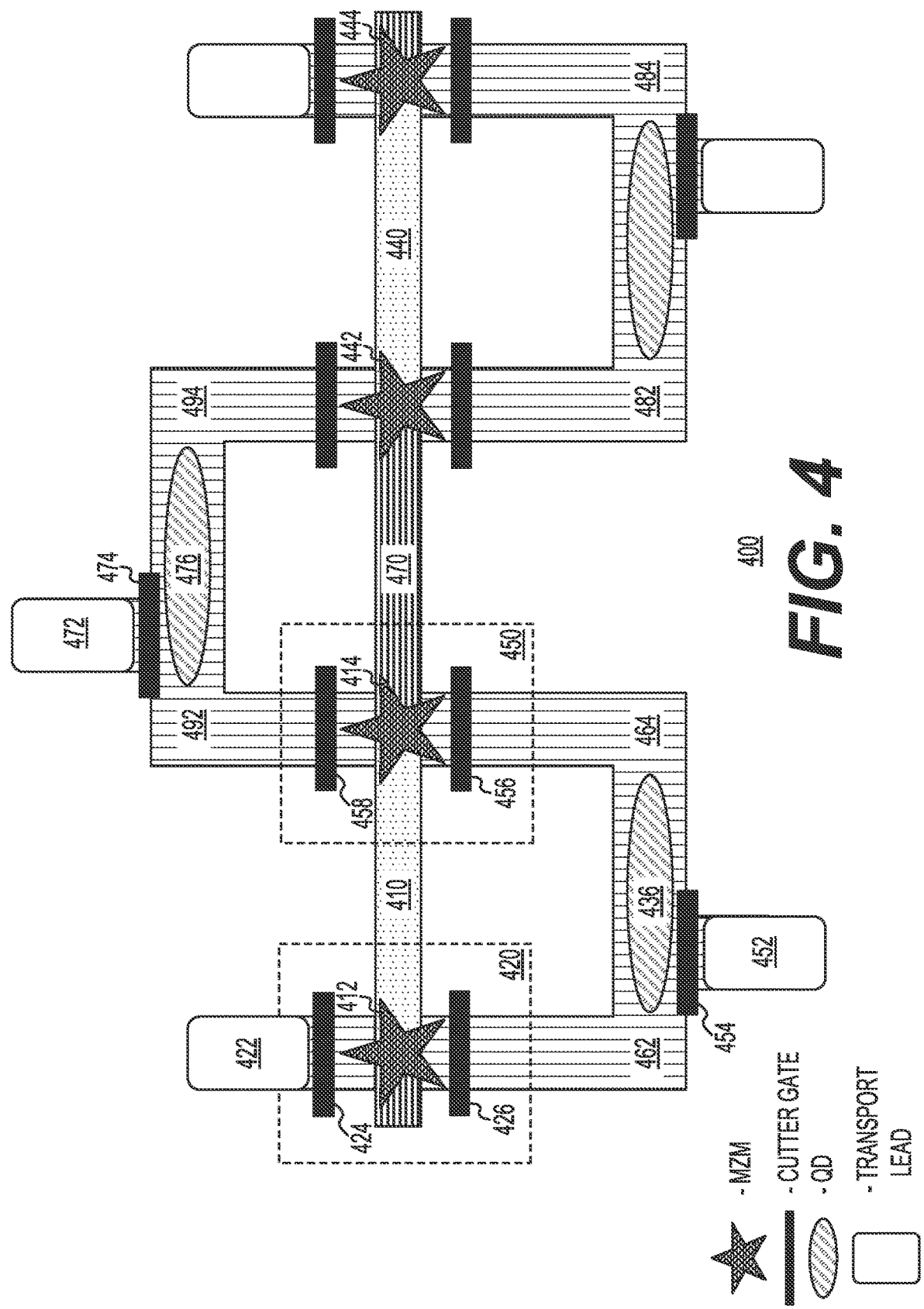
FIG. 4 is a block diagram of a quantum device with two-sided dual-purpose MZM junctions in accordance with one example.

FIG. 4 is a block diagram of a quantum device 400 with two-sided dual-purpose MZM junctions in accordance with another example. Quantum device 400 may include topological superconductors (e.g., 410 and 440) that are coupled via a trivial superconductor 470 (e.g., a qubit backbone). The combination of the topological superconductors and the backbone may be referred to as a superconducting island. Each of superconductors 410, 440, and 470, may be formed as nanowires. As an example, superconductors 410, 440, and 470 may be formed as superconductor wires (e.g., indium arsenide (InAs) wires) coated by a superconductor (e.g., aluminum (Al)). Ends of topological superconductor 410 may further be coupled via semiconducting regions 462 and 464. Ends of topological superconductor 440 may further be coupled via semiconducting regions 482 and 484. Ends of trivial superconductor 470 may be coupled via semiconducting regions 492 and 494. In one example, the terms topological and trivial refer to the phase of the superconductor and even a single superconducting nanowire can have sections that are tuned using electrostatic gates to form topological or trivial superconducting sections.

With continued reference to FIG. 4, quantum device 400 is operated such that Majorana zero modes (MZMs) 412 and 414 are formed at the ends of topological superconductor 410 and MZMs 442 and 444 are formed at the ends of topological superconductor 440. MZM junctions corresponding to the MZMs may allow for the tunable coupling of MZMs to each other or to transport leads. As an example, quantum device 400 is shown as having a two-sided dual-purpose MZM junction 420, which connects the MZM (e.g., MZM 412) to two conductors, one of which is a transport lead 422 and the other one of which (quantum dot 436) can either be configured to be in a grounded state, thus acting as a transport lead, or in the Coulomb blockade state. Either side of the junction is independently tunable, which can be achieved through designated cutter gates. The junction can be tuned so that both sides of the junction are completely pinched off, for instance in the qubit configuration when that MZM is not being measured. MZM junction 420 includes cutter gates 424 and 426, and a region adjacent quantum dot 436 and a region adjacent transport lead 422. Depending on the voltages applied to cutter gates 424 and 426, respectively, the region adjacent to quantum dot 436 (acting as one conductor) and the region adjacent to transport lead 422 (acting as the other conductor) may be tuned. Moreover, the region adjacent quantum dot 436 can either be configured to be grounded when the cutter gate 454 opens the connection to the transport lead 452, or the quantum dot 436 can be configured to be in Coulomb blockade when the cutter gate 454 is fully pinched off.

Still referring to FIG. 4, quantum device 400 is shown as having another two-sided dual-purpose MZM junction 450 that includes cutter gates 456 and 458, and region adjacent quantum dots 436 and 476. Depending on the voltages applied to cutter gates 456 and 458, respectively, the region adjacent to quantum dots 436 and 476 may be tuned. Quantum dots 436 and 476 may be configured to be grounded or in Coulomb blockade by tuning cutter gates 454 and 474, respectively to the adjacent transport leads 452 and 472. Advantageously, having two-sided dual-purpose MZM junctions (e.g., MZM junction 420 and MZM junction 450) that can couple MZMs to transport leads facilitates the tuning of superconductors 410 and 440 of quantum device 400 into the topological phase. Moreover, the same two-sided dual-purpose MZM junctions also allow MZMs to be disconnected from transport leads (e.g., transport lead 422, transport lead 452, or transport lead 472) and be connected to quantum dots (e.g., quantum dot 436 or quantum dot 476) in Coulomb blockade, which is needed for qubit measurement. Although FIG. 4 shows quantum device 400 as including a certain number of components arranged and coupled in a certain way, quantum device 400 may include fewer or additional components arranged and coupled differently.

The two-sided dual-purpose MZM junctions described above may be implemented using various example gate configurations. Example gate configurations described herein relate to a layout for a two-dimensional electron gas (2DEG) qubit where the superconducting wires are formed on the underlying 2DEG. As part of this example configuration, gates are used to deplete the 2DEG in most of the plane, and to configure quantum dots and tunable junctions in the regions of interest. In one example, the 2DEG underlying the gates may be manufactured by forming a series of layers of semiconductors on a substrate (e.g., using any of indium phosphide (InP) substrate, indium arsenide (InAs), indium antimonide (InSb), mercury cadmium telluride (HgCdTe), or any appropriate combination of materials selected from groups II, III, IV, V, or VI of the periodic table, or any ternary compounds of three different atoms of materials selected from groups II, III, IV, V, or VI of the periodic table). As an example, the 2DEG may further include a buffer layer (e.g., an indium aluminum arsenide (InAlAs) layer) formed over the substrate. The 2DEG may further include a quantum well layer (e.g., an indium arsenide (InAs) layer) formed over the buffer layer, and another buffer layer formed over the quantum well layer. Each of these layers may be formed using molecular-beam epitaxy (MBE). As an example, the MBE related process may be performed in an MBE system that allows the deposition of the appropriate materials in a vacuum. Topologically active areas may be defined by depositing a metal layer (e.g., aluminum (Al)) and using electrostatic gates and an applied magnetic field to tune into the topological phase.

Figure 5:
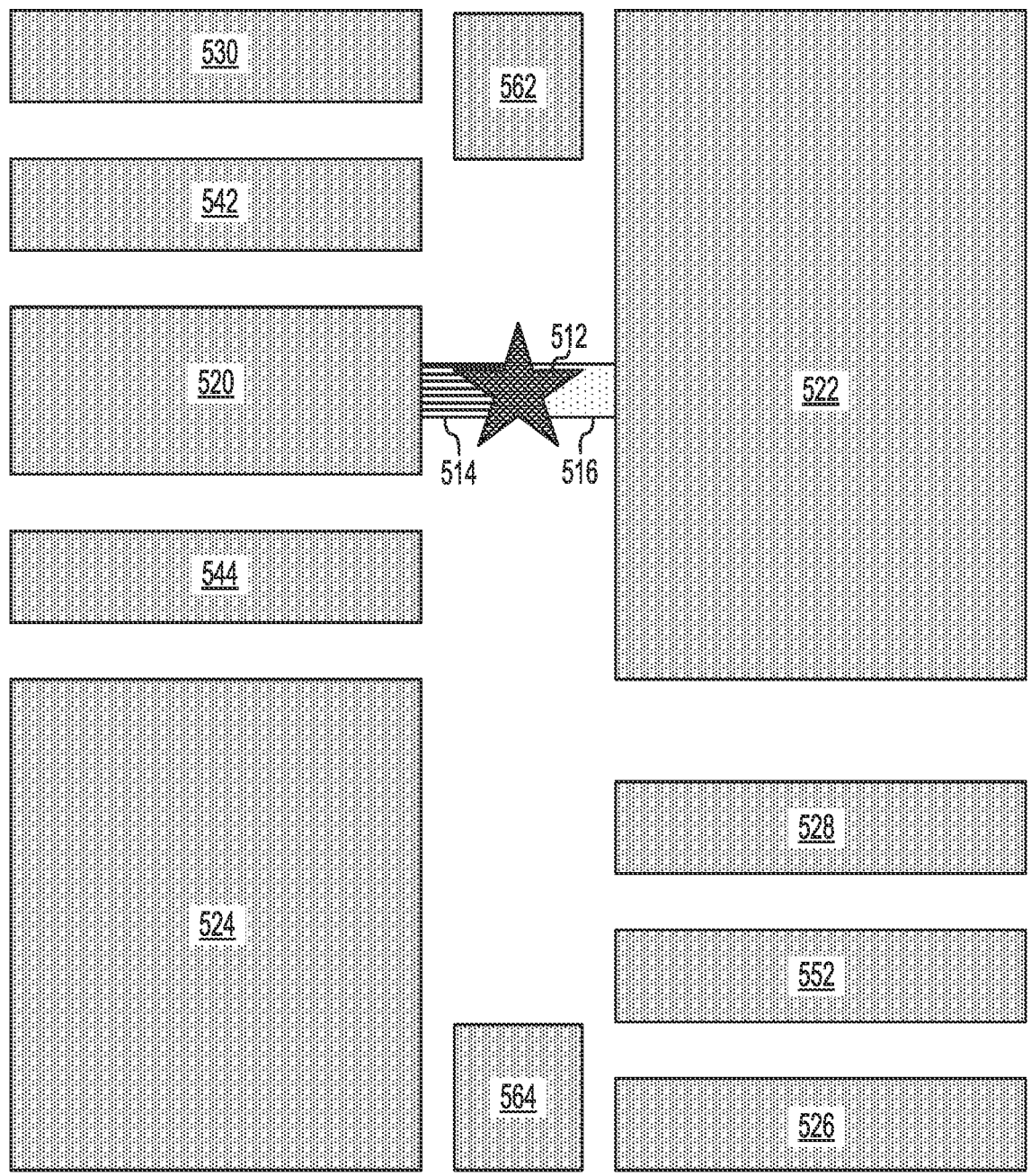
FIG. 5 shows a top view of an example single-layer gate configuration for a two-sided dual-purpose MZM junction associated with the quantum device of FIG. 4.

FIG. 5 shows a top view 500 of an example single layer gate configuration for MZM junction 420 associated with quantum device 400 of FIG. 4. MZM 512 corresponds to MZM 412 of FIG. 4. Topological superconductor portion 516 corresponds to a portion of topological superconductor 410 of FIG. 4. FIG. 5 further shows a trivial superconductor portion 514 next to MZM 512. Individual gates described as part of the single layer gate configuration may serve more than one purpose. As an example, certain cutter gates may both deplete the 2DEG under them, and control the tunnel coupling in the uncovered adjacent junction to them. Similarly, QD plunger gates may deplete the 2DEG under the gate, and control the quantum dot tuning in the uncovered semiconductor region adjacent to them. Gate 520 may perform the functions of a trivial superconductor plunger gate and a depletion gate. Gate 522 may perform the functions of a topological superconductor plunger gate and a depletion gate. Gate 528 may perform the function of a QD side plunger gate and a depletion gate. Gates 524, 526, and 530 may be configurable as depletion gates to remove electrons from selected areas of the underlying 2DEG. Gates 542, 544, and 552 are configurable as side cutter gates. Transport leads 562 and 564 may also act as accumulating gates. Cutter gate 542 (corresponding to cutter gate 424 of FIG. 4) may be used to control the coupling of the MZM (e.g., MZM 512) to transport lead portion 562 (corresponding to transport lead 422 of FIG. 4). Cutter gate 544 (corresponding to cutter gate 426 of FIG. 4) may be used to control the coupling of the MZM (e.g., MZM 512) to the adjacent quantum dot (e.g., quantum dot 436 of FIG. 4), whose density is controlled by the quantum dot/plunger gate 528. Thus, either side of the junction is independently tunable, which is achieved through designated cutter gates. The junction can be tuned so that both sides of the junction are completely pinched off, for instance in the qubit configuration when that MZM is not being measured. Cutter gate 552 may be used to control the coupling of the MZM (e.g., MZM 512) to another transport lead 564. Similar gate configurations may be used with the other quantum devices (e.g., quantum devices 100, 200, and 300 described earlier). Although FIG. 5 shows a certain gate configuration corresponding to an MZM junction, other gate configurations may also be used to implement the functionality of the MZM junction.

Figure 6:
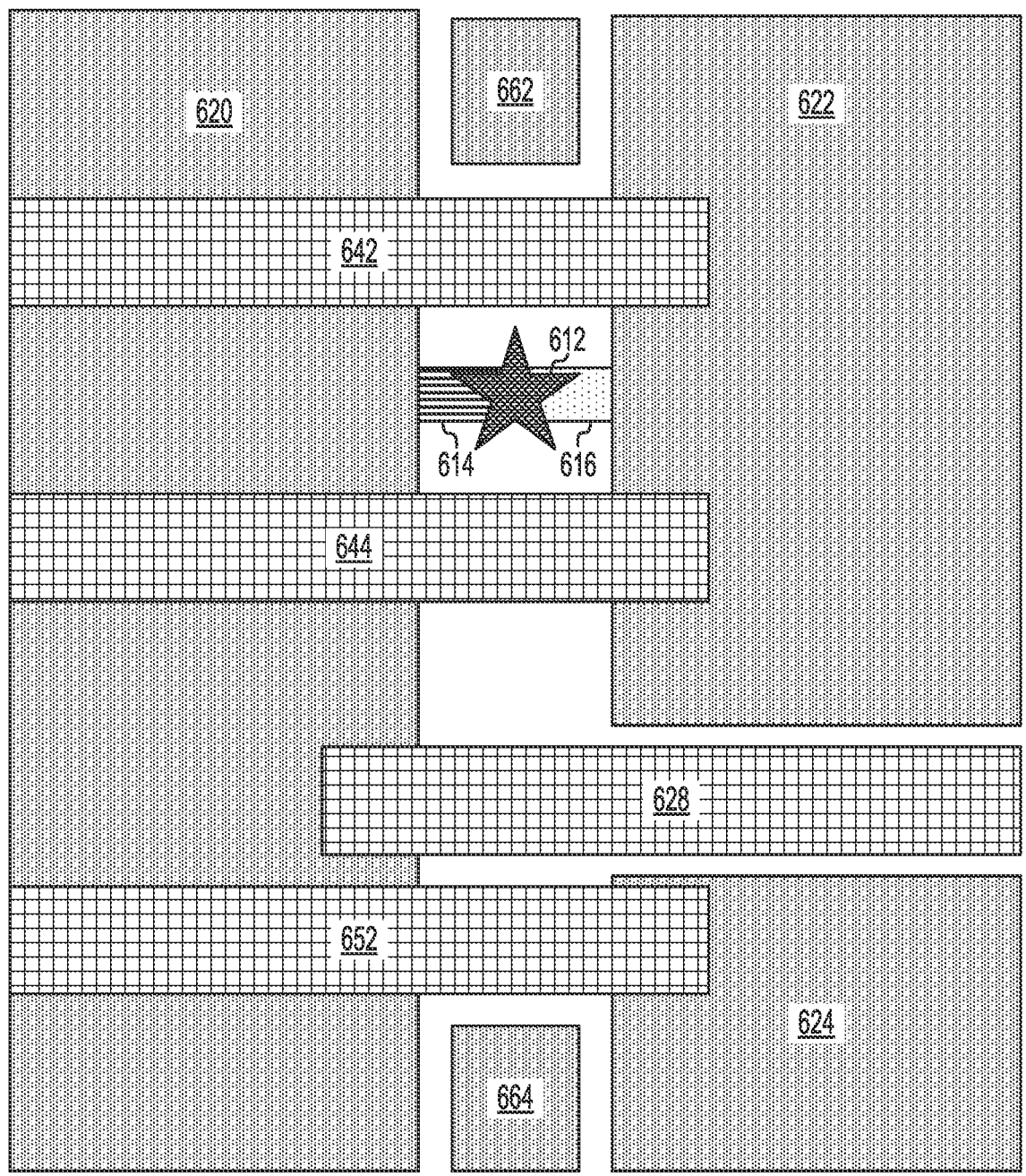
FIG. 6 shows a top view of an example dual-layer gate configuration for a two-sided dual-purpose MZM junction associated with the quantum device of FIG. 4.

FIG. 6 shows a top view 600 of an example dual layer gate configuration for MZM junction 420 associated with quantum device 400 of FIG. 4. MZM 612 corresponds to MZM 412 of FIG. 4. Topological superconductor portion 616 corresponds to a portion of topological superconductor 410 of FIG. 4. FIG. 6 further shows a trivial superconductor portion 614 next to MZM 612. Gate 620 may perform the functions of a trivial superconductor plunger gate and a depletion gate. Gate 622 may perform the function of a topological superconductor plunger gate and a depletion gate. Gates 624 and 628 may be configurable as depletion gates to remove electrons from selected areas of the underlying 2DEG. Gates 620, 622, and 624 may be formed in a first layer. Gate 628 may be formed in a second layer, different from the first layer, to control the density of quantum dot 436 of FIG. 4. Gates 642, 644, and 652 are configurable as cutter gates and these gates may be formed in a second layer, different from the first layer. Cutter gate 642 (corresponding to cutter gate 424 of FIG. 4) may be used to control the coupling of the MZM (e.g., MZM 612) to transport lead portion 662 (corresponding to transport lead 422 of FIG. 4). Cutter gate 644 (corresponding to cutter gate 426 of FIG. 4) may be used to control the coupling of the MZM (e.g., MZM 612) to the adjacent quantum dot (e.g., quantum dot 436 of FIG. 4) under QD plunger gate 628. Cutter gate 652 may be used to control the coupling of transport lead portion 664 to the quantum dot under QD plunger gate 628. Thus, either side of the MZM junction is independently tunable using cutter gates 642 and 644, and the conductor on one side of the junction is configurable to be in Coulomb blockade or grounded using cutter gate 652. The MZM junction can be tuned so that both sides of the junction are completely pinched off, for instance in the qubit configuration when the MZM is not being measured. Similar gate configurations may be used with the other quantum devices (e.g., quantum devices 100, 200, and 300 described earlier). Although FIG. 6 shows a certain gate configuration corresponding to an MZM junction, other gate configurations may also be used to implement the functionality of the MZM junction.

Figure 7:
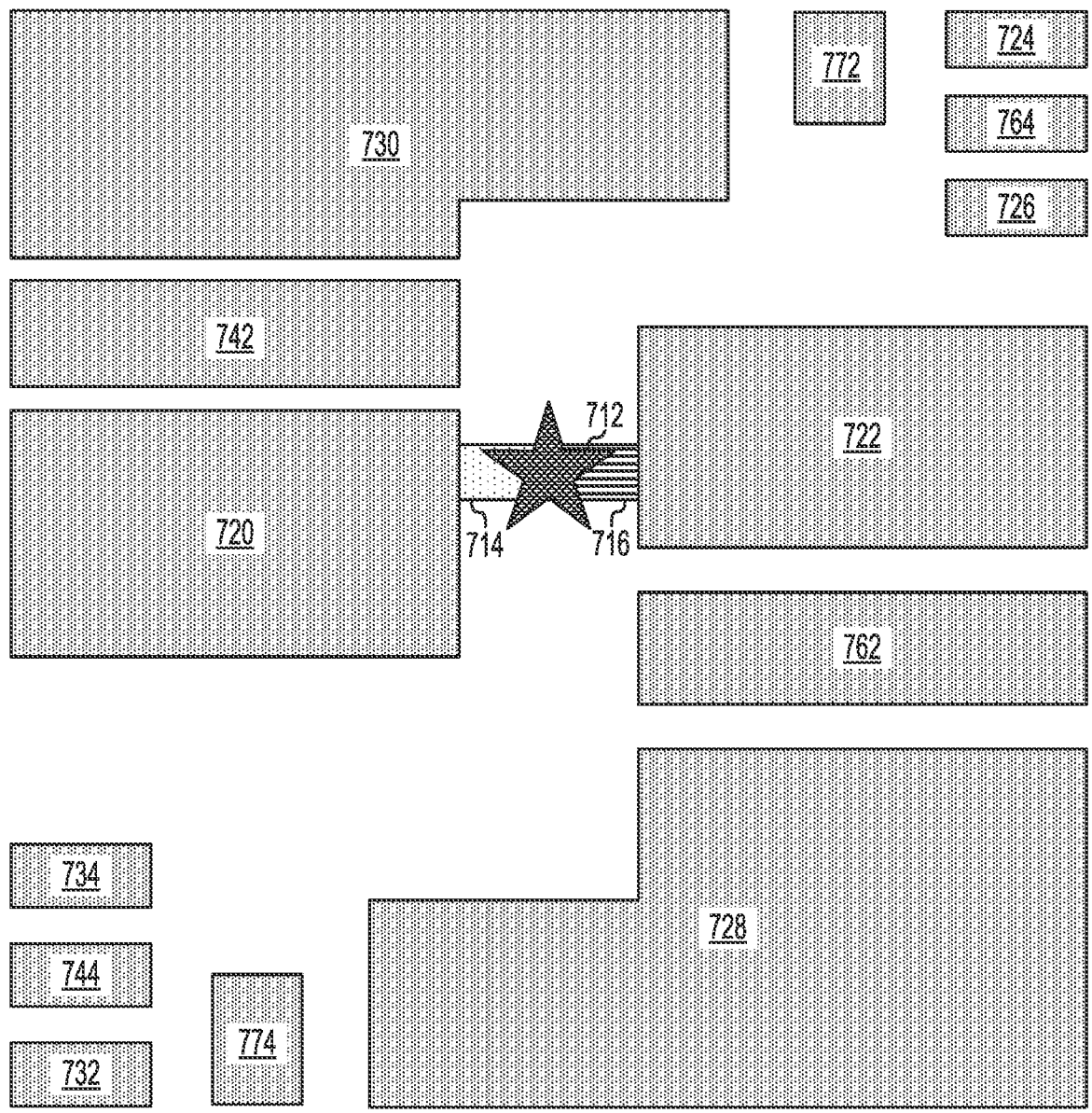
FIG. 7 shows a top view of another example single-layer gate configuration for a two-sided dual-purpose MZM junction associated with the quantum device of FIG. 4.

FIG. 7 shows a top view 700 of an example single layer gate configuration for MZM junction 450 associated with quantum device 400 of FIG. 4. MZM 712 corresponds to MZM 414 of FIG. 4. Topological superconductor portion 714 corresponds to a portion of topological superconductor 410 of FIG. 4. FIG. 7 further shows a trivial superconductor portion 716 next to MZM 712. Trivial superconductor portion 716 corresponds to a portion of trivial superconductor 470 of FIG. 4. As noted earlier, individual gates described as part of the single layer gate configuration may serve more than one purpose. As an example, certain cutter gates may both deplete the 2DEG under them, and control the tunnel coupling in the uncovered adjacent junction to them. Similarly, QD plunger gates may deplete the 2DEG under the gate, and control the quantum dot tuning in the uncovered semiconductor region adjacent to them. Gate 720 may perform the functions of a topological superconductor plunger gate and a depletion gate. Gate 722 may perform the functions of a trivial superconductor plunger gate and a depletion gate. Gates 724, 728, 730, and 732 may be configurable as depletion gates to remove electrons from selected areas of the underlying 2DEG. Gates 742, 744, 762, and 764 are configurable as side cutter gates. Each of gates 726 and 734 may perform the functions of a QD side plunger gate and a depletion gate. Transport leads 772 and 774 may also act as accumulating gates. Cutter gate 744 (corresponding to cutter gate 454 of FIG. 4) may be used to control the coupling of the quantum dot (e.g., quantum dot 436 of FIG. 4) adjacent to QD plunger gate 734 to transport lead portion 774 (corresponding to transport lead 452 of FIG. 4). Cutter gate 764 (corresponding to cutter gate 474 of FIG. 4) may be used to control the coupling of the quantum dot (e.g., quantum dot 476 of FIG. 4) adjacent to QD plunger gate 726 to transport lead portion 772 (corresponding to transport lead 472 of FIG. 4). Cutter gate 742 (corresponding to cutter gate 458 of FIG. 4) may be used to control the coupling of the MZM (e.g., MZM 712) to the adjacent quantum dot (e.g., quantum dot 476 of FIG. 4), whose density is controlled by QD plunger gate 726. Cutter gate 762 (corresponding to cutter gate 456 of FIG. 4) may be used to control the coupling of the MZM (e.g., MZM 712) to the adjacent quantum dot (e.g., quantum dot 436 of FIG. 4), whose density is controlled by QD plunger gate 734. Thus, either side of the junction is independently tunable, which is achieved through designated cutter gates. The junction can be tuned so that both sides of the junction are completely pinched off, for instance in the qubit configuration when that MZM is not being measured. Similar gate configurations may be used with the other quantum devices (e.g., quantum devices 100, 200, and 300 described earlier). Although FIG. 7 shows a certain gate configuration corresponding to an MZM junction, other gate configurations may also be used to implement the functionality of the MZM junction.

Figure 8:
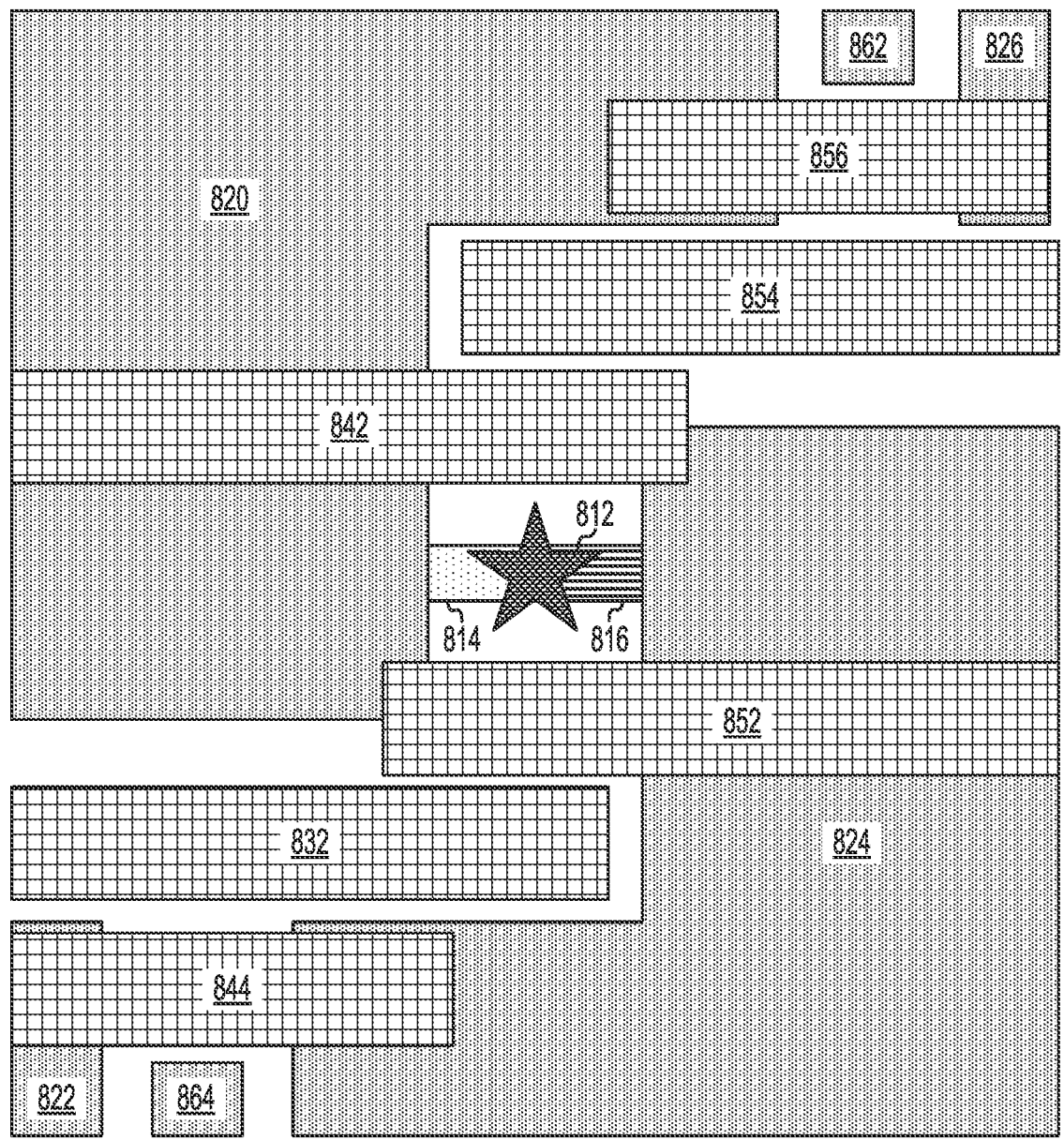
FIG. 8 shows a top view of another example dual-layer gate configuration for a two-sided dual-purpose MZM junction associated with the quantum device of FIG. 4.

FIG. 8 shows a top view 800 of an example dual layer gate configuration for MZM junction 450 associated with quantum device 400 of FIG. 4. MZM 812 corresponds to MZM 412 of FIG. 4. Topological superconductor portion 814 corresponds to a portion of topological superconductor 410 of FIG. 4. FIG. 8 further shows a trivial superconductor portion 816 next to MZM 812. Trivial superconductor portion 816 corresponds to trivial superconductor 470 of FIG. 4. Gate 820 may perform the functions of a topological superconductor plunger gate and a depletion gate. Gate 824 may perform the function of a trivial superconductor plunger gate and a depletion gate. Gates 822, and 826 may be configurable as depletion gates to remove electrons from selected areas of the underlying 2DEG. These gates may be formed in a first layer. Each of gates 832 and 854 may perform the function of a QD plunger gate and may act as a depletion gate or an accumulation gate. In this example, gates 832 and 854 are formed in a second layer, different from the first layer. Gates 842, 844, 852, and 856 are configurable as cutter gates and these gates may be formed in a second layer, different from the first layer. Cutter gate 844 (corresponding to cutter gate 454 of FIG. 4) may be used to control the coupling of the quantum dot (e.g., quantum dot 436 of FIG. 4) under QD plunger gate 832 to transport lead portion 864 (corresponding to transport lead 452 of FIG. 4). Cutter gate 856 (corresponding to cutter gate 474 of FIG. 4) may be used to control the coupling of the quantum dot (e.g., quantum dot 476 of FIG. 4) under QD plunger gate 854 to transport lead portion 862 (corresponding to transport lead 472 of FIG. 4). Cutter gate 842 (corresponding to cutter gate 458 of FIG. 4) may be used to control the coupling of the MZM to the adjacent quantum dot (e.g., quantum dot 476 of FIG. 4). Cutter gate 852 (corresponding to cutter gate 456 of FIG. 4) may be used to control the coupling of the MZM to the adjacent quantum dot (e.g., quantum dot 436 of FIG. 4). Thus, the conductor on either side of the junction is configurable to be grounded or in Coulomb blockade using cutter gates 844 and 856, and either side of the junction to the MZM is independently tunable using cutter gates 842 and 852. The junction can be tuned so that both sides of the junction are completely pinched off, for instance in the qubit configuration when that MZM is not being measured. Similar gate configurations may be used with the other quantum devices (e.g., quantum devices 100, 200, and 300 described earlier). Although FIG. 8 shows a certain gate configuration corresponding to an MZM junction, other gate configurations may also be used to implement the functionality of MZM junction.

Figure 9:
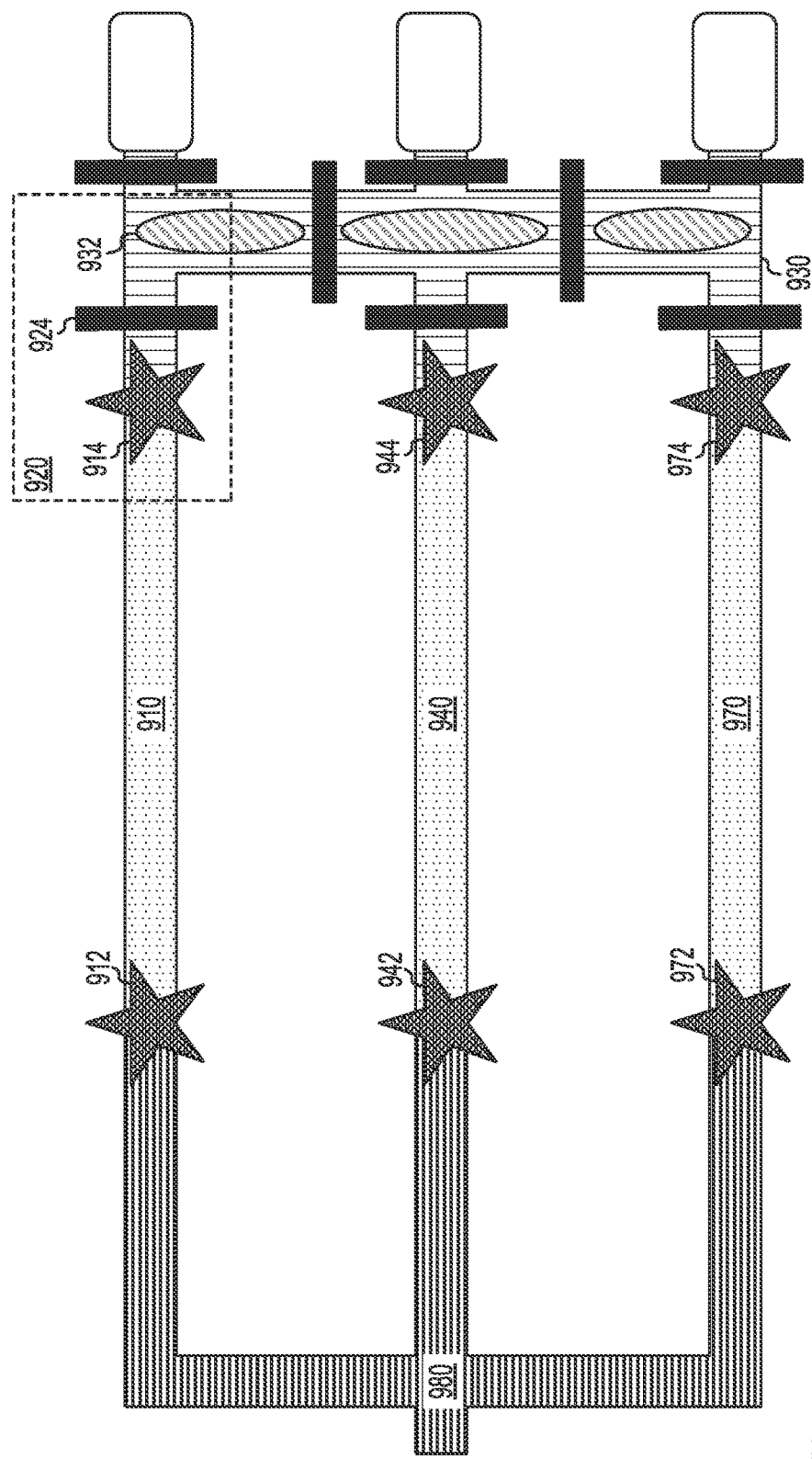
FIG. 9 is a block diagram of a quantum device with single-sided dual-purpose Majorana zero mode (MZM) junctions in accordance with one example.

FIG. 9 is a block diagram of a quantum device 900 with single-sided dual-purpose Majorana zero mode (MZM) junctions in accordance with one example. Quantum device 900 may include topological superconductors (e.g., 910, 940, and 970) that are coupled via a trivial superconductor 980 (e.g., a qubit backbone). The combination of the topological superconductors and the backbone may be referred to as a superconducting island. Each of superconductors 910, 940, and 970 may be formed as nanowires. Trivial superconductor 980 may be formed as a network of nanowires. As an example, superconductors 910, 940, 970, and 980 may be formed as superconductor wires (e.g., indium arsenide (InAs) wires) coated by a superconductor (e.g., aluminum (Al)). One end of topological superconductors 910, 940, and 970 may further be coupled via a semiconducting region 930. In one example, the terms topological and trivial refer to the phase of the superconductor and even a single superconducting nanowire can have sections that are tuned using electrostatic gates to form topological or trivial superconducting sections.

Figure 10:
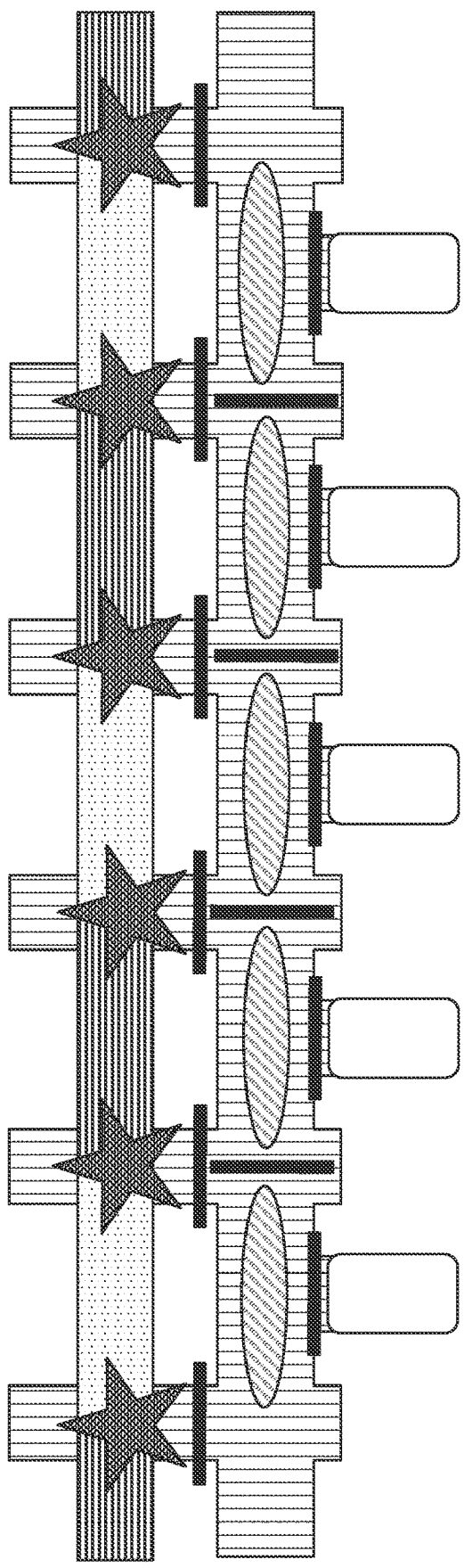
FIG. 10 shows an additional block diagram of another example quantum device with single-sided dual-purpose MZM junctions.

With continued reference to FIG. 9, quantum device 900 is operated such that Majorana zero modes (MZMs) 912 and 914 are formed at the ends of topological superconductor 910, MZMs 942 and 944 are formed at the ends of topological superconductor 940, and MZMs 972 and 974 are formed at the ends of topological superconductor 970. A single-sided dual-purpose junction contacts the MZM on just one side of the wire; it thus couples the MZM to a single conductor, which can be configured to function either as a transport lead or as a quantum dot in the Coulomb blockade regime. As an example, quantum device 900 is shown as having a single-sided dual-purpose MZM junction 920, which connects MZM 914 to a conductor, which can be configured to be in a grounded state or in a Coulomb blockade state. MZM junction 920 includes a cutter gate 924 and a region adjacent quantum dot 932. Depending on the voltage applied to cutter gate 924, the region adjacent to quantum dot 932 may be tuned. The coupling to the conductor (e.g., the quantum dot) is controlled through a designated cutter gate (e.g., cutter gate 924), that can be fully pinched off when that MZM is not being measured. A benefit of a single-sided dual-purpose junction (e.g., MZM junction 920) is that there is a single-type of junction that needs to be optimized for the qubit, which can be simpler for experiments. Although FIG. 9 shows quantum device 900 as including a certain number of components arranged and coupled in a certain way, quantum device 900 may include fewer or additional components arranged and coupled differently. As an example, FIG. 10 shows an additional block diagram of another example of quantum device 1000 with single-sided dual-purpose MZM junctions.

Figure 11:
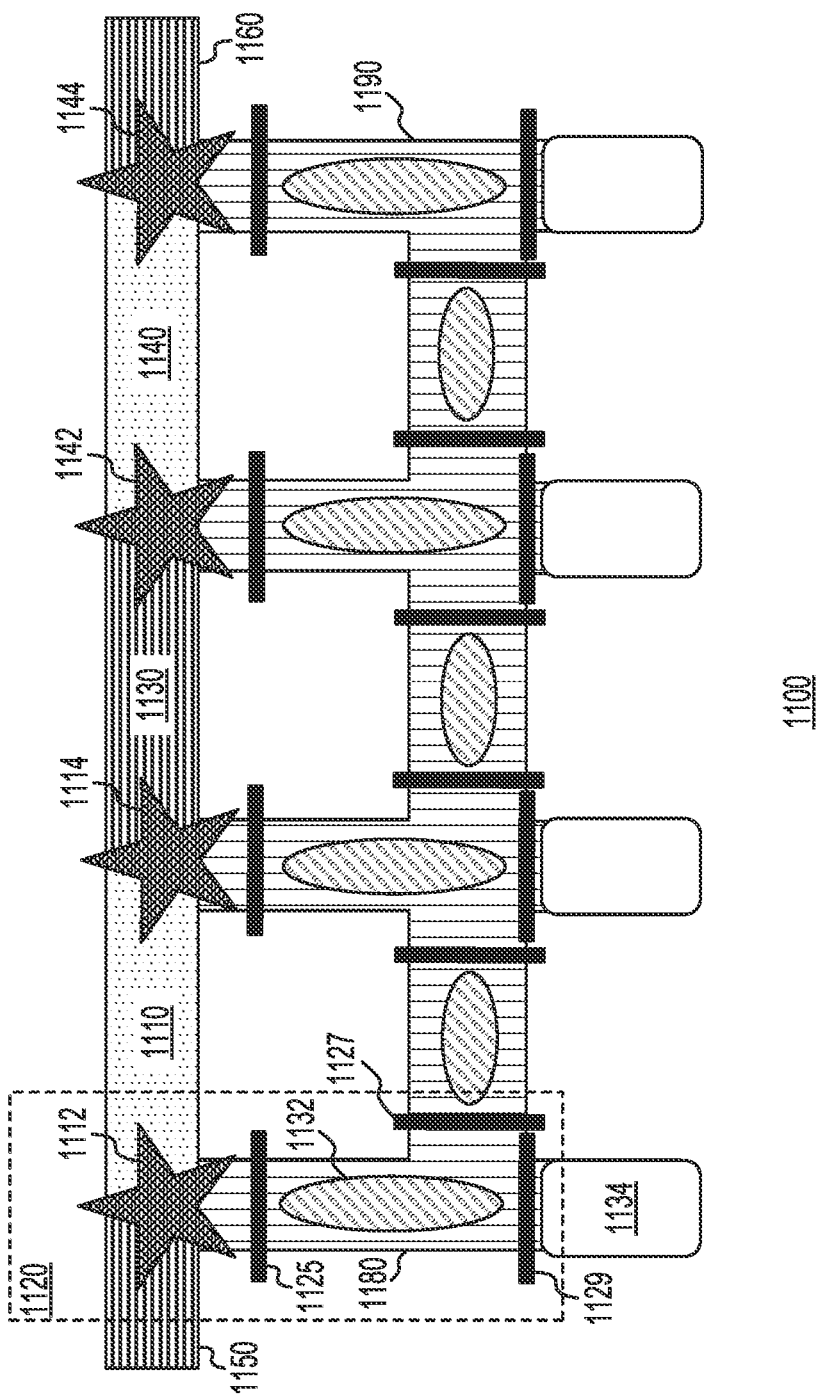
FIG. 11 is a block diagram of a quantum device with single-sided dual-purpose MZM junctions in accordance with one example.
Figure 11:
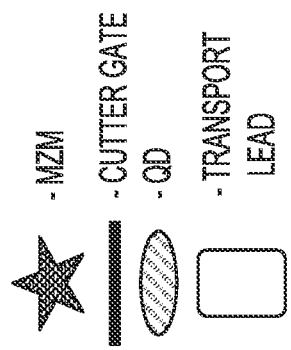

FIG. 11 is a block diagram of a quantum device 1100 with single-sided dual-purpose MZM junctions in accordance with one example. Quantum device 1100 may include topological superconductors (e.g., 1110 and 1140) that are coupled via a trivial superconductor 1130 (e.g., a qubit backbone). The combination of the topological superconductors and the backbone may be referred to as a superconducting island. Trivial superconductors (e.g., trivial superconductors 1150 and 1160) may abut topological superconductors (e.g., 1110 and 1140) as shown in FIG. 11. Each of superconductors 1110, 1130, 1140, 1150, and 1160 may be formed as nanowires. As an example, superconductors 1110, 1130, 1140, 1150, and 1160 may be formed as superconductor wires (e.g., indium arsenide (InAs) wires) coated by a superconductor (e.g., aluminum (Al)). In one example, the terms topological and trivial refer to the phase of the superconductor and even a single superconducting nanowire can have sections that are tuned using electrostatic gates to form topological or trivial superconducting sections.

With continued reference to FIG. 11, quantum device 1100 is operated such that Majorana zero modes (MZMs) 1112 and 1114 are formed at the ends of topological superconductor 1110 and MZMs 1142 and 1144 are formed at the ends of topological superconductor 1140. Cutter gates formed in semiconducting regions (e.g., semiconducting regions 1180 and 1190) adjoining the MZMs may allow for the tunable coupling of MZMs to each other or to transport leads. A single-sided dual-purpose junction contacts the MZM on just one side of the wire; it thus couples the MZM to a single conductor, which can be configured to function either as a transport lead or as a quantum dot in the Coulomb blockade regime. As an example, quantum device 1100 is shown as having a single-sided dual-purpose MZM junction 1120 that includes cutter gates 1125, 1127, and 1129, and a quantum dot 1132 that results in a coupling of MZM 1112 to transport lead 1134. Depending on the voltage applied to cutter gate 1125, the region adjacent to quantum dot 1132 may be tuned. The coupling to the conductor (e.g., the quantum dot) is controlled through a designated cutter gate (e.g., cutter gate 1125), that can be fully pinched off when that MZM is not being measured. A benefit of a single-sided dual-purpose junction (e.g., MZM junction 1120) is that there is a single-type of MZM junction that needs to be optimized for the qubit, which can be simpler for experiments. Although FIG. 11 shows quantum device 1100 as including a certain number of components arranged and coupled in a certain way, quantum device 1100 may include fewer or additional components arranged and coupled differently.

The single-sided dual-purpose MZM junctions described above may be implemented using various example gate configurations. Example gate configurations described herein relate to a layout for a two-dimensional electron gas (2DEG) qubit where the superconducting wires are formed on the underlying 2DEG. As part of this example configuration, gates are used to deplete the 2DEG in most of the plane, and to configure quantum dots and tunable junctions in the regions of interest. In one example, the 2DEG underlying the gates may be manufactured by forming a series of layers of semiconductors on a substrate (e.g., using any of indium phosphide (InP) substrate, indium arsenide (InAs), indium antimonide (InSb), mercury cadmium telluride (HgCdTe), or any appropriate combination of materials selected from groups II, III, IV, V, or VI of the periodic table, or any ternary compounds of three different atoms of materials selected from groups II, III, IV, V, or VI of the periodic table). As an example, the 2DEG may further include a buffer layer (e.g., an indium aluminum arsenide (InAlAs) layer) formed over the substrate. The 2DEG may further include a quantum well layer (e.g., an indium arsenide (InAs) layer) formed over the buffer layer, and another buffer layer formed over the quantum well layer. Each of these layers may be formed using molecular-beam epitaxy (MBE). As an example, the MBE related process may be performed in an MBE system that allows the deposition of the appropriate materials in a vacuum. Topologically active areas may be defined by depositing a metal layer (e.g., aluminum (Al)) and using electrostatic gates and an applied magnetic field to tune into the topological phase.

Figure 12:
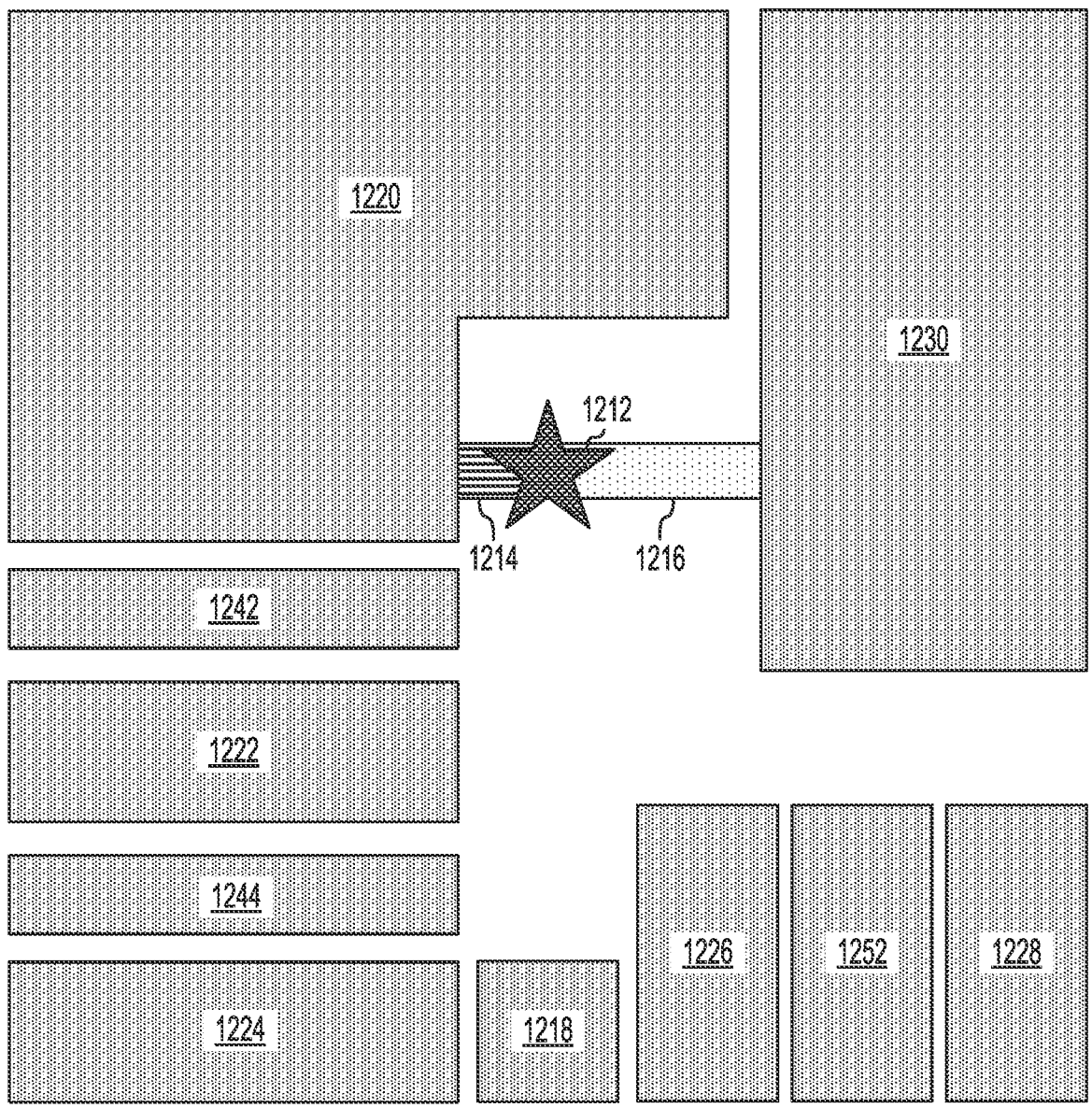
FIG. 12 shows a top view of an example single-layer gate configuration for a single-sided dual-purpose MZM junction associated with the quantum device of FIG. 11.

FIG. 12 shows a top view 1200 of an example single-layer gate configuration for single-sided dual-purpose MZM junction 1120 associated with quantum device 1100 of FIG. 11. MZM 1212 corresponds to MZM 1112 of FIG. 11. Trivial superconductor portion 1214 corresponds to a trivial superconductor 1150 of FIG. 11 and topological superconductor portion 1216 corresponds to topological superconductor 1110 of FIG. 11. Transport lead portion 1218 corresponds to transport lead 1134 of FIG. 11. As noted earlier, individual gates described as part of the single layer gate configuration may serve more than one purpose. As an example, certain cutter gates may both deplete the 2DEG under them, and control the tunnel coupling in the uncovered adjacent junction to them. Similarly, QD plunger gates may deplete the 2DEG under the gate, and control the quantum dot tuning in the uncovered semiconductor region adjacent to them. Gate 1220 may perform the functions of a trivial superconductor plunger gate and a depletion gate. Gates 1222, 1224, and 1226 may be configurable as depletion gates to remove electrons from selected areas of the underlying 2DEG. Gate 1228 may perform the functions of a QD side plunger gate and a depletion gate. Gate 1230 may perform the functions of a topological superconductor plunger gate and a depletion gate. Gates 1242, 1244, and 1252 are configurable as side cutter gates. Transport lead 1218 may also act as an accumulating gate. Cutter gate 1244 (corresponding to cutter gate 1129 of FIG. 11) may be used to control the coupling of the MZM (e.g., MZM 1112) to transport lead portion 1218 (corresponding to transport lead 1134 of FIG. 11). Cutter gate 1252 (corresponding to cutter gate 1127 of FIG. 11) may be used to control the coupling of the MZM (e.g., MZM 1212) to transport lead portion 1218 (corresponding to transport lead 1134 of FIG. 11). Cutter gate 1242 (corresponding to cutter gate 1125 of FIG. 11) may be used to control the density of the adjacent quantum dot (e.g., quantum dot 1132 of FIG. 11). Similar gate configurations may be used with the other quantum devices with single-sided dual-purpose MZM junctions (e.g., quantum device 900 of FIG. 9 and quantum device 1000 of FIG. 10 described earlier). Although FIG. 12 shows a certain gate configuration corresponding to an MZM junction, other gate configurations may also be used to implement the functionality of the MZM junction.

Figure 13:
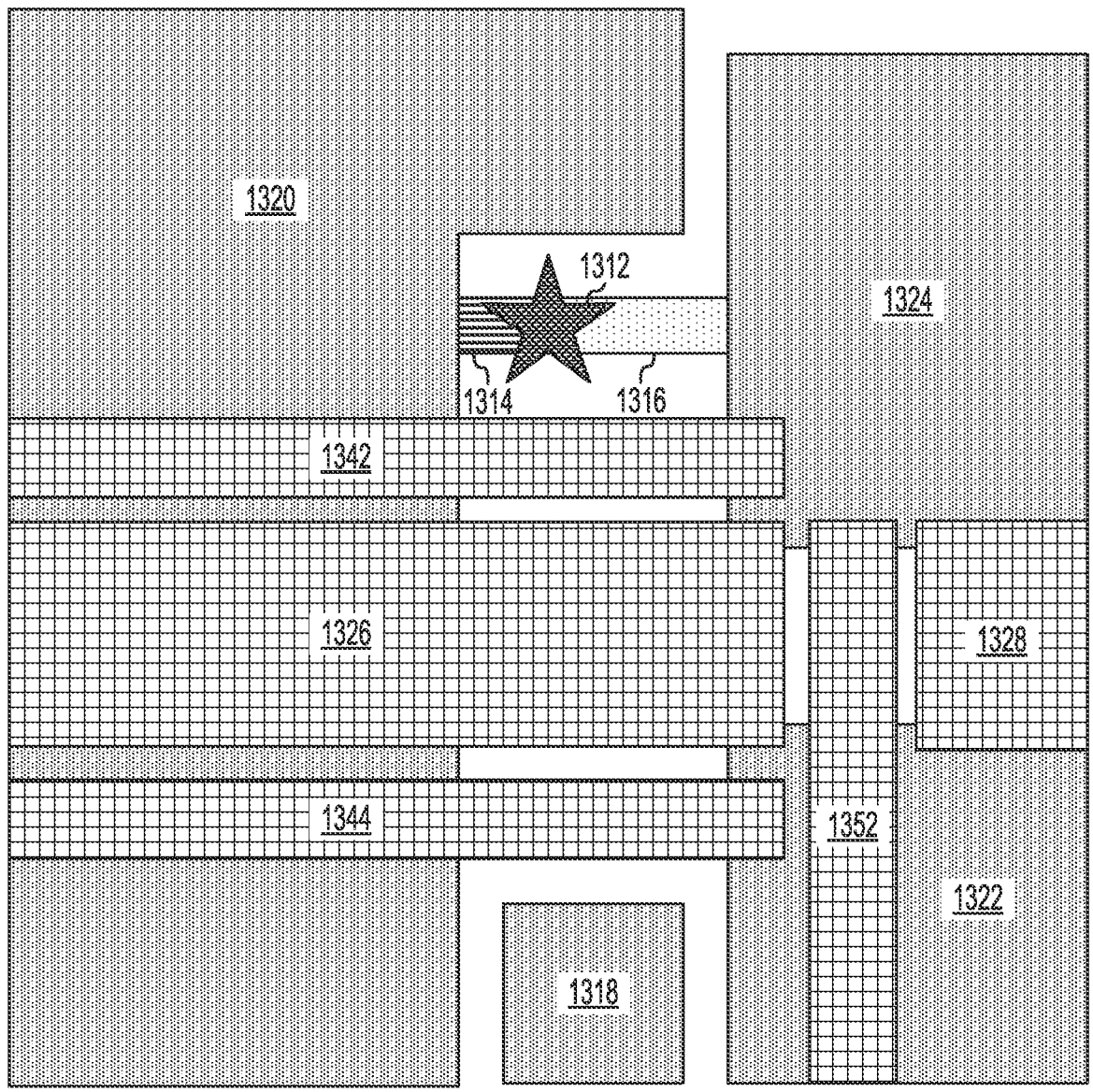
FIG. 13 shows a top view of an example dual-layer gate configuration for a single-sided dual-purpose MZM junction associated with the quantum device of FIG. 11.

FIG. 13 shows a top view 1300 of an example dual-layer gate configuration for single-sided dual-purpose MZM junction 1120 associated with quantum device 1100 of FIG. 11. MZM 1312 corresponds to MZM 1112 of FIG. 11. Trivial superconductor portion 1314 corresponds to a trivial superconductor 1150 of FIG. 11 and topological superconductor portion 1316 corresponds to topological superconductor 1110 of FIG. 11. Transport lead portion 1318 corresponds to transport lead 1134 of FIG. 11. Gate 1320 may perform the functions of a trivial superconductor plunger gate and a depletion gate. Gate 1322 may be configurable as a depletion gate to remove electrons from selected areas of the underlying 2DEG. Gate 1324 may perform the functions of a topological superconductor plunger gate and a depletion gate. Gates 1320, 1322, and 1324 may be formed in a first layer. Gates 1326 and 1328 may also be configurable as QD plunger gates that are formed in a second layer, different from the first layer. Gates 1342, 1344, and 1352 are configurable as cutter gates and these gates may be formed in a second layer, different from the first layer. Cutter gate 1344 (corresponding to cutter gate 1129 of FIG. 11) may be used to control the coupling of the quantum dot under QD plunger gate 1326 to transport lead portion 1318 (corresponding to transport lead 1134 of FIG. 11). Cutter gate 1352 (corresponding to cutter gate 1127 of FIG. 11) may be used to control the coupling between two adjacent quantum dots. Cutter gate 1342 (corresponding to cutter gate 1125 of FIG. 11) may be used to control the coupling to the adjacent quantum dot (e.g., quantum dot 1132 of FIG. 11). Similar gate configurations may be used with the other quantum devices with single-sided dual-purpose MZM junctions (e.g., quantum device 900 of FIG. 9 and quantum device 1000 of FIG. 10 described earlier). Although FIG. 13 shows a certain gate configuration corresponding to an MZM junction, other gate configurations may also be used to implement the functionality of the MZM junction.

In conclusion, the present disclosure relates to a quantum device comprising at least one superconducting island configurable to support at least one pair of Majorana zero modes (MZMs). The quantum device may further include a first conductor configurable to be coupled with at least one MZM of the at least one pair of MZMs, where the first conductor is configurable to be in at least one of a grounded state or a Coulomb blockade state. The quantum device may further include a second conductor configurable to be coupled with the at least one MZM of the at least one pair of MZMs, where the second conductor is configurable to be in at least one of a grounded state or a Coulomb blockade state.

Each of the first conductor and the second conductor may be configurable to be coupled to the at least one MZM of the at least one pair of MZMs via a tunable coupling. The first conductor may be configurable to be coupled via a first coupling and the second conductor may be configurable to be coupled via a second coupling, and each of the first coupling and the second coupling may be independently tunable. The first conductor may be configurable as a transport lead when in the grounded state or as a quantum dot when in the Coulomb blockade state. The second conductor may be configurable as a transport lead when in the grounded state or as a quantum dot when in the Coulomb blockade state.

The quantum device may further include a two-dimensional electron gas (2DEG), where a set of gates formed on the 2DEG is configurable to control the tunable coupling. Each of the set of gates may be formed in a single layer. Alternatively, or additionally, a first subset of the set of gates may be formed in a first layer and a second subset of the set of gates may be formed in a second layer, different from the first layer.

In another example, the present disclosure relates to a quantum device comprising at least one superconducting island configurable to support at least one pair of Majorana zero modes (MZMs). The quantum device may further include a conductor configurable to be coupled with at least one MZM of the at least one pair of MZMs, where the conductor is configurable to be in at least one of a grounded state or a Coulomb blockade state.

The conductor may be configurable to be coupled to the at least one MZM of the at least one pair of MZMs via a tunable coupling. The conductor may be configurable as a transport lead when in the grounded state or as a quantum dot when in the Coulomb blockade state.

The quantum device may further include a two-dimensional electron gas (2DEG), where a set of gates formed on the 2DEG is configurable to control the tunable coupling. Each of the set of gates may be formed in a single layer. Alternatively, or additionally, a first subset of the set of gates may be formed in a first layer and a second subset of the set of gates may be formed in a second layer, different from the first layer. The quantum device may further comprise a cutter gate for tuning the tunable coupling.

In yet another example, the present disclosure relates to a quantum device comprising at least one superconducting island configurable to support at least one pair of Majorana zero modes (MZMs). The quantum device may further include a first conductor configurable to be coupled with at least one MZM of the at least one pair of MZMs via a first tunable coupling, where the first conductor is configurable to be in at least one of a grounded state or a Coulomb blockade state. The quantum device may further include a first cutter gate for tuning the first tunable coupling. The quantum device may further include a second conductor configurable to be coupled with the at least one MZM of the at least one pair of MZMs via a second tunable coupling, where the second conductor is configurable to be in at least one of a grounded state or a Coulomb blockade state. The quantum device may further include a second cutter gate for tuning the second tunable coupling independent of the first tunable coupling.

The first conductor may be configurable as a transport lead when in the grounded state or as a quantum dot when in the Coulomb blockade state. The second conductor may be configurable as a transport lead when in the grounded state or as a quantum dot when in the Coulomb blockade state.

The quantum device may further include a two-dimensional electron gas (2DEG), where a set of gates formed on the 2DEG is configurable to control the tunable coupling. Each of the set of gates may be formed in a single layer. Alternatively, or additionally, a first subset of the set of gates may be formed in a first layer and a second subset of the set of gates may be formed in a second layer, different from the first layer.

It is to be understood that the systems, devices, methods, and components described herein are merely examples. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality. Merely because a component, which may be an apparatus, a structure, a device, a system, or any other implementation of a functionality, is described herein as being coupled to another component does not mean that the components are necessarily separate components. As an example, a component A described as being coupled to another component B may be a sub-component of the component B, the component B may be a sub-component of the component A, or components A and B may be a combined sub-component of another component C.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to a specific example are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed:

1. A quantum device comprising:
   at least one superconducting island, including a superconductor backbone and a plurality of topological superconductors, wherein each of the plurality of topological superconductors includes one or more two-sided dual-purpose junctions;
   a first conductor, in response to a first set of voltages applied to a plurality of cutter gates, configured to be coupled with a first side of a respective two-sided dual-purpose junction, wherein the first conductor is configured to be in at least one of a grounded state or a Coulomb blockade state; and
   a second conductor, in response to a second set of voltages, different from the first set of voltages, applied to the plurality of cutter gates, configured to be coupled with a second side of the two-sided dual-purpose junction, opposite to the first side of the respective two-sided dual-purpose junction, wherein the second conductor is configured to be in at least one of a grounded state or a Coulomb blockade state.

2. The quantum device of claim 1, wherein each of the first conductor and the second conductor is configured to be coupled to a respective side of the respective two-sided dual-purpose junction via a tunable coupling.

3. The quantum device of claim 1, wherein the first conductor is configured to be coupled via a first coupling and the second conductor is configured to be coupled via a second coupling, and wherein each of the first coupling and the second coupling is independently tunable.

4. The quantum device of claim 1, wherein the first conductor is configured as a transport lead when in the grounded state or as a quantum dot when in the Coulomb blockade state.

5. The quantum device of claim 4, wherein the second conductor is configured as a transport lead when in the grounded state or as a quantum dot when in the Coulomb blockade state.

6. The quantum device of claim 2, further comprising a two-dimensional electron gas (2DEG), wherein a set of depletion gates formed on the 2DEG is configured to remove electrons from selected areas of the underlying 2-DEG.

7. The quantum device of claim 6, wherein each of the set of depletion gates and the plurality of cutter gates is formed in a single layer.

8. The quantum device of claim 6, wherein the set of depletion gates is formed in a first layer and each of the plurality of cutter gates is formed in a second layer, different from the first layer.

9. A quantum device comprising:
at least one superconducting island, including a superconductor backbone and a plurality of topological superconductors, wherein each of the plurality of topological superconductors includes one or more two-sided dual-purpose junctions; and
a conductor in response to a set of voltages applied to a plurality of cutter gates, configured to be coupled with a first side of a respective two-sided dual-purpose junction, wherein the conductor is configured to be in at least one of a grounded state or a Coulomb blockade state.

10. The quantum device of claim 9, wherein the conductor is configured to be coupled to the the first side of the respective two sided dual-purpose junction via a tunable coupling.

11. The quantum device of claim 9, wherein the conductor is configured as a transport lead when in the grounded state or as a quantum dot when in the Coulomb blockade state.

12. The quantum device of claim 10, further comprising a two-dimensional electron gas (2DEG), wherein a set of depletion gates formed on the 2DEG is configured to remove electrons from selected areas of the underlying 2-DEG.

13. The quantum device of claim 12, wherein each of the set of depletion gates and the plurality of cutter gates is formed in a single layer.

14. The quantum device of claim 12, wherein the set of depletion gates is formed in a first layer and each of the plurality of cutter gates is formed in a second layer, different from the first layer.

15. The quantum device of claim 10, further comprising a cutter gate for tuning the tunable coupling.

16. A quantum device comprising:
at least one superconducting island, including a superconductor backbone and a plurality of topological superconductors, wherein each of the plurality of topological superconductors includes one or more two-sided dual-purpose junctions;
a first conductor configurable to be coupled with a first side of a respective two-sided dual-purpose junction via a first tunable coupling, wherein the first conductor is configured to be in at least one of a grounded state or a Coulomb blockade state;
a first cutter gate for tuning the first tunable coupling;
a second conductor configured to be coupled with a second side of the two-sided dual-purpose junction, opposite to the first side of the respective two-sided dual-purpose junction, via a second tunable coupling, wherein the second conductor is configured to be in at least one of a grounded state or a Coulomb blockade state; and
a second cutter gate for tuning the second tunable coupling independent of the first tunable coupling.

17. The quantum device of claim 16, wherein the first conductor is configured as a transport lead when in the grounded state or as a quantum dot when in the Coulomb blockade state, and wherein the second conductor is configured as a transport lead when in the grounded state or as a quantum dot when in the Coulomb blockade state.

18. The quantum device of claim 16, further comprising a two-dimensional electron gas (2DEG), wherein a set of gates formed on the 2DEG is configured to control each of the first tunable coupling and the second tunable coupling.

19. The quantum device of claim 18, wherein each of the set of gates is formed in a single layer.

20. The quantum device of claim 18, wherein a first subset of the set of gates is formed in a first layer and a second subset of the set of gates is formed in a second layer, different from the first layer.

* * * * *